INVENTOR.
SHELDON L. MATLOW
BY Fleit, Hohbach, Test, Albritton & Herbert
ATTORNEYS INVENTOR.
SHELDON L. MATLOW
BY Flehr, Hohbach, Test, Albritton & Herbert
ATTORNEYS

METHOD FOR DEPOSITING THIN FILMS IN CONTROLLED PATTERNS

Filed May 24, 1967 4 Sheets-Sheet 3

INVENTOR.
SHELDON L. MATLOW
BY Fleher, Hohbach, Test, Albritton & Herbert
ATTORNEYS

METHOD FOR DEPOSITING THIN FILMS IN CONTROLLED PATTERNS

Filed May 24, 1967

4 Sheets-Sheet 4

INVENTOR.
SHELDON L. MATLOW

BY Fleit, Hohbach, Test, Albritton & Herbert
ATTORNEYS

United States Patent Office 3,543,394

Patented Dec. 1, 1970

3,543,394

METHOD FOR DEPOSITING THIN FILMS IN CONTROLLED PATTERNS

Sheldon L. Matlow, 556 St. Claire Drive, Palo Alto, Calif. 94306

Filed May 24, 1967, Ser. No. 640,926
Int. Cl. H01l 7/18
U.S. Cl. 29—584 22 Claims

ABSTRACT OF THE DISCLOSURE

An apparatus for forming patterned deposits of thin films of material on the surface of a substrate. The apparatus includes a vacuum chamber and an associated vacuum system. A support within said chamber for supporting a substrate and means for selectively cooling or heating the same. One or more reagent sources for selectively introducing reagent vapors into said chamber. A means responsive to control signals for bombarding selected areas of the surface of a substrate on said support.

A method for forming patterned deposits of thin films of selected material on the surface of a substrate to form active and passive electronic devices and components.

This invention relates generally to a method and apparatus for depositing thin films in controlled patterns.

Patterned deposits of thin films of material are used in many industries. One such industry is the semiconductor industry with the new and growing field of integrated or micro circuits. In many industries, the control of line width and line spacings in the pattern is not critical. Printing and silk screening techniques are adequate to form the patterned thin film deposit.

Where control of line width and spacing is critical, the standard method presently in use is essentially as follows: the material which is to form the patterned thin film is deposited over the entire substrate; thereafter, a photoresist is applied over the deposit; the photoresist is exposed to light through a photographic mask; the non-exposed photoresist is chemically removed; the unwanted portions of the thin film material are chemically etched away; and the photoresist is removed from the remainder of the surface to leave the patterned thin film of material.

This technique, although widely used, has a number of drawbacks: it is costly, time consuming, difficult to control, and frequently produces undesirable contamination.

It is a general object of the present invention to provide an improved method and apparatus for depositing patterned thin films of selected materials.

It is still a further object of the present invention to provide a method and apparatus in which patterned thin films can be deposited with accurate and precise dimensional control.

It is still a further object of the present invention to provide a relatively clean method and apparatus for depositing thin films.

It is another object of the present invention to provide an economical method and apparatus for depositing patterned thin films of material.

In accordance with the present invention, patterned thin films of selected materials are deposited on a substrate by condensing and freezing in vacuum one or more vapors having atoms characteristic of the desired material onto the surface of a substrate to form a solid or frozen film. The film is then scanned with a high energy beam, such as an electron beam, to transfer energy into selected regions of the film, defining the desired pattern, and convert these regions into a form which is solid and stable at normal operating temperatures. Subsequently, the substrate is heated whereby the unconverted portions of the frozen film evaporate leaving the desired pattern of converted thin film on the surface of the substrate. For thicker films, deposits of different materials or interlocking patterns of materials, the process is repeated employing selected vapors.

The foregoing and other objects of the invention will become more clearly apparent from the following description when taken in conjunction with the accompanying drawings.

Referring to the drawings.

APPARATUS

Figure 1:
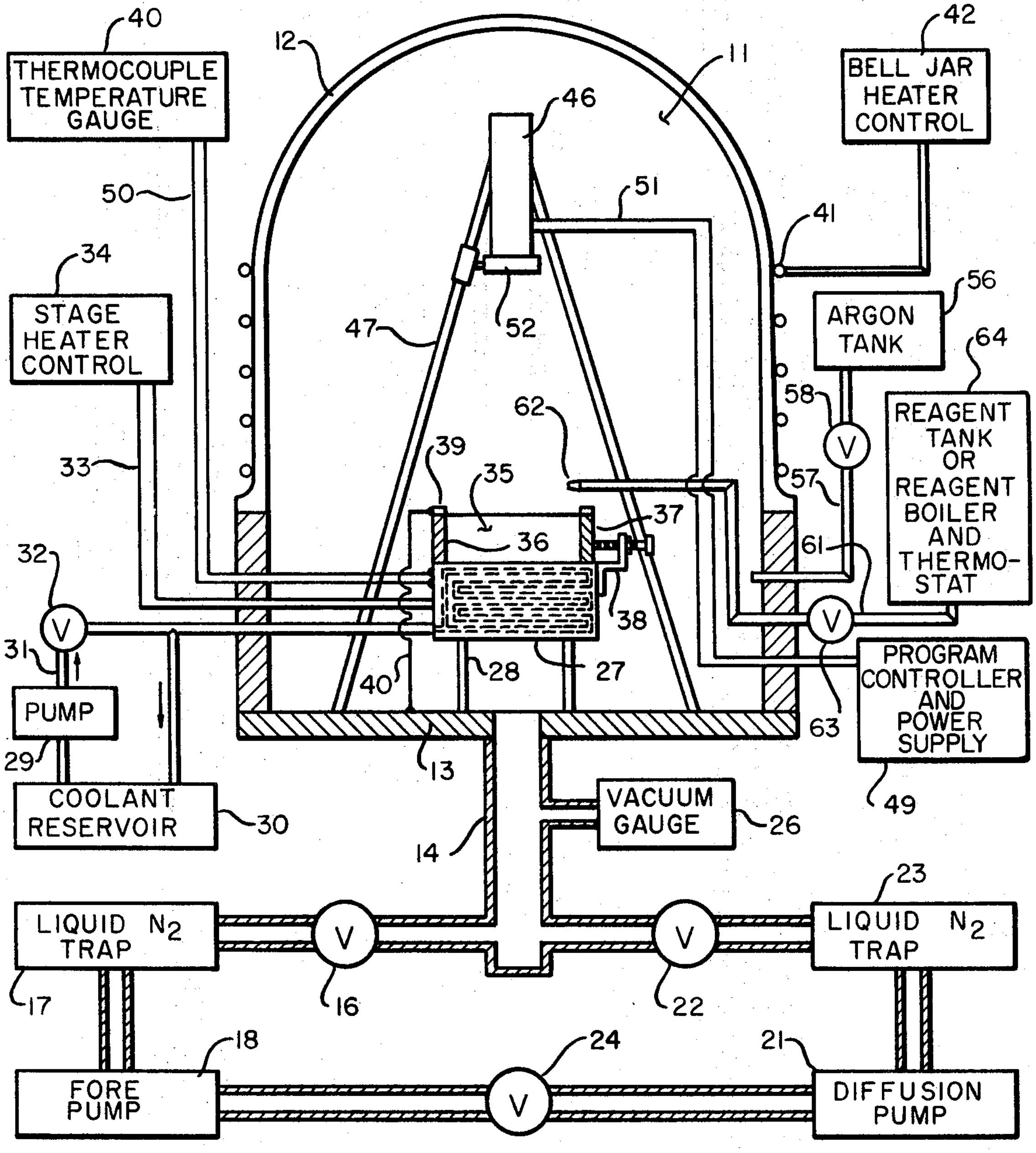
FIG. 1 shows an apparatus in accordance with the present invention.

Apparatus in accordance witt the invention includes a vacuum chamber 11, FIG. 1. The chamber may comprise a bell jar 12 suitably sealed to a table or base plate 13. The chamber 11 is evacuated by a suitable vacuum system. The vacuum system includes a heater 14 connected via a first valve 16 and nitrogen trap 17 to a fore pump 18. This portion of the vacuum system performs the rough pumping.

In addition, there is provided a diffusion pumping system or ion pumping system for obtaining the desired vacuums after the initial rough pumping. This diffusion pumping system includes a diffusion pump 21 connected to the header via valve 22 and liquid nitrogen trap 23. The other side of the diffusion pump is connected to the fore pump 18 via valve 24. After the chamber 11 has been rough pumped, the valve 16 is closed while the valves 22 and 24 are opened thereby connecting the diffusion pump and the fore pump to the header 14. A vacuum gauge 26 may be connected to the header 14 to indicate the pressure.

A stage or support 27 for the substrate to be treated is supported from the base plate 13 by supports 28. The stage includes means for cooling and heating the same. For this purpose, the stage may include a block of heat conductive material having a plurality of tubular passages through which a cooling fluid may be circulated, as shown. The cooling fluid may comprise liquid nitrogen supplied by a pump 29 from a reservoir 30 via the conduits 31. A valve 32 is provided for controlling the flow of cooling fluid.

In addition, a heater is provided to selectively heat the stage to evaporate unconverted film following a patterned conversion. The heater may be a resistive heater embedded within the stage and connected by power lines 33 to a heater control 34.

Thus, the stage may be cooled to a desired low temperature by circulating a suitable coolant such as liquid nitrogen, liquid hydrogen, carbon dioxide cooled alcohols or other refrigerated liquids, through the stage. When the patterned conversion of the film has been completed, the coolant is turned off and the stage heated to a temperature which will evaporate the unconverted film.

A clamping means is provided for holding a substrate 35 on the stage 27. The clamping means may include a fixed member 36 and movable member 37 associated with a screw assembly 38. A ground means 39 is connected to the clamping members. The ground means 39 is grounded to the base plate by lead 40.

The temperature of the stage is indicated by means of a suitable temperature indicating device. For example, the thermocouple gauge 40 including leads 50 may be employed.

In certain instances it is desirable to heat the bell jar 12. An electrical heater 41 is wound on the outer surface of the bell jar and connected to a heater control 42 for this purpose. It may be desirable to heat the bell jar to evaporate any condensate from the inner surface of the bell jar prior to carrying out out an operation.

The apparatus illustrated in FIG. 1 includes means for forming an electron beam to selected areas or regions of the substrate. Such means may comprise an electron gun 46 supported from the base plate as by the supports 47. Electrical power and control voltages are supplied from a programmer 49 through the cable 51. Thus, heater current is supplied to the cathode, accelerating voltages to the anodes, beam forming voltages to the various electrodes, and scanning voltages to the deflection means whereby a beam is formed and caused to scan and bombard predetermined areas of the substrate. The open end of the electron gun includes a shutter 52 which is electrically opened and closed to protect the electron gun while material is being deposited and removed from the substrate.

The chamber 11 is connected to an argon tank 56 by conduit 57 which includes a valve 58 for controlling the flow of argon into the chamber. The argon is used to flush out and purge the vacuum chamber 11 and to return the chamber to atmospheric pressure. In addition, there is provided means for introducing into the vacuum chamber reagent gases or vapors containing the atoms of material forming the desired patterned film. Such means may include a conduit 61 extending into the chamber and having an outlet 62 adjacent the substrate surface. A valve 63 is adapted to control the flow of reagent vapor into the bell jar. The conduit 61 is connected to a reagent tank 64, reagent boiler or other source of vapor. Additional reagent sources and associated conduits and inlets may be provided for introducing into the chamber vapors sequentially or in mixture.

If the reagent is a liquid or solid at room temperature, a thermostatically controlled heater or boiler serves to control the vapor pressure of the reagent.

GENERAL DESCRIPTION

Figure 2:
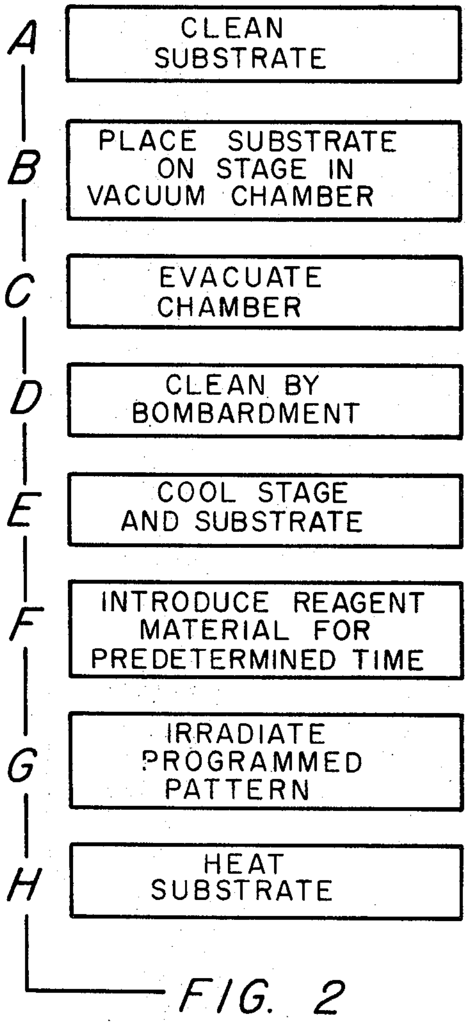
FIG. 2 is a flow diagram showing generally the steps in carrying out the method of the present invention.

A general description of the method of the present invention is presented before detailed descriptions of the formation of typical patterned films and devices are described. The steps in carrying out the method of the present invention are illustrated in the diagram presented in FIG. 2. Initially, the fore pump 18, diffusion pump 21 and reagent boilers 64, if the reagents are liquids or solids, are turned on, so that they are in full operation when the substrate is ready for treatment. The substrate is first cleaned to remove any contaminants and oxide film from the surface to be treated. This initial cleaning may comprise dipping the substrate in hydrofluoric acid or other suitable cleaning agents and then washing it in filtered deionized or distilled water, FIG. 2A. The substrate is then dried and placed on the stage, FIG. 2B. The chamber is evacuated by connecting the fore pump to the chamber. After the pressure has dropped to approximately 1 micron, the bell jar heater is turned on. After a period of time, valve 16 is closed and argon is admitted into the chamber. Valve 58 is then closed and valve 16 is opened. When the pressure is again about 1 micron, valve 16 is closed and valve 58 is opened, admitting argon into the chamber. Valve 58 is then closed, valve

16 is opened and the pressure is reduced to about 1 micron. Valve 16 is then closed and valves 24 and 22 are opened.

As soon as pressure in the bell jar is in the order of $10^{-6}$ to $10^{-7}$ millimeters of mercury, the shutter 52 is opened and the electron gun turned on. The programmer is set so that the electron beam scans the entire surface of the substrate, FIG. 2D. This serves to further cleanse the surface of the substrate by bombarding off any contaminants.

The valve 32 is then opened and coolant flows through the stage and cools the stage and substrate, FIG. 2E. The coolant is selected so that the temperature of the substrate is low enough to freeze the reagent being used and to ensure that the reagent vapor pressure is less than $10^{-7}$ mm. When the thermocouple gauge 40 indicates that the stage and substrate have achieved the desired low temperature, valve 63 is opened for a predetermined period of time to allow reagent vapors to flow into the vacuum chamber 11 adjacent the surface of the substrate, FIG. 2F. The reagent is preferably directed toward the surface of the substrate. The reagent vapor condenses and freezes primarily in the cold substrate surface. The thickness of the frozen film is dependent upon the vapor pressure of the reagent, the temperature of the substrate and period of time the substance is exposed to the reagent vapors.

The compound which is to be used is one which is solid at the temperature of the stage when it is cooled. Since most compounds that might be used are solids at liquid nitrogen temperature, liquid nitrogen is preferably employed. For some compounds, however, other coolants can be and should be used. Since the stage and substrate present their coldest surface to the vapors, all other surfaces being at room temperature or higher, the vapors will condense primarily on the surfaces of the stage and the substrate.

As previously stated, it includes the atoms of the material which it is desired to deposit. In some cases, the entire molecule will form the film such as the case where styrene is introduced and bombarded or radiated to form polystyrene. For some film materials, it may be necessary to introduce several vapors or vapors of compounds to provide oll the required types of atoms. In those cases in which the molecules of different chemicals react with each other in the vapor phase, the vapors are introduced sequentially in the order of increasing volatility. The present discusion shall be restricted to the discussion of the use of a single chemical compound.

When the desired thickness of condensate has been obtained, the reagent supply is shut off. The shutter of the electron beam gun is opened. The programmer is set to bombard the surface with the electron beam in the desired pattern, FIG. 2G. The electronically programmed electron gun bombards the substrate only where the deposited thin film pattern is desired. When a monocrystalline film is desired, a second higher power bombardment may be necessary. A single bombardment at high power might vaporize the material rather than convert it to a stable form. When the electron beam has completed is scanning operation, it is turned off, the coolant flow is stopped by closing the valve 32 and the stage heater is turned on, FIG. 2H. Where the condensate has been bombarded, the film is converted to a stable compound at normal temperatures. In all other areas, the condensate is in its virgin condition. Thus, as the stage and the substrate heat up, the unreacted material will volatize and be removed from the system by the vacuum pumps leaving in place the desired thin film pattern of selected material. In some cases, the chemical reaction will have been completed by the bombardment. In other cases, the reaction will go to completion during the heating phase.

It is seen that the patterns are controlled by electronically controlling the electron gun. The electron beam can be focused to an extremely small spot size and accurately controlled; thus, very fine lines and great accuracy can be obtained. Since the condensate is a solid, the control of line width is extremely good since there is negligible diffusion to adjacent portions. The rate at which the reactants can diffuse in solid at the given low temperatures is many orders of magnitude lower that the rate at which they can diffuse in liquid or vapor phase. This is not the case where the condensate is a liquid rather than a solid. It is also not true where the material to be bombarded is in the vapor phase and is bombarded from the vapor phase into the solid phase onto the surface of the substrate. The vapor phase reaction has a further disadvantage in that the electron beam will be scattered by the vapor molecules and will thus produce a diffused uncontrollable pattern on the surface of the substrate.

FORMATION OF PATTERNED SILICON THIN FILM

To demonstrate the breadth of the invention and to illustrate various modes of operation of the apparatus, the formation of a thin silicon film on a silicon substrate is described. The steps followed are in accordance with the process described above. Thus, the description is restricted to the type of materials employed and the steps followed. In the formation of a silicon film, the reagent is silicon tetrachloride, $SiCl_4$. The stage is cooled by liquid nitrogen.

As is well known, the power of the electron beam is the product of the acceleration voltage and beam current. The conversion of silicon tetrachloride at three different power levels is substantially as follows: In the low power level, it produces some decomposition of the film but does not melt the silicon tetrachloride; at the medium power level some decomposition is produced and the bombarded regions melt; and at the high power level, the silicon tetrachloride film is substantially decomposed and liquid silicon is produced.

In the lower power mode, the silicon atoms produced by the electron beam bombardment will be trapped in the lattices of the silicon tetrachloride crystallities. As the substrate is heated in the heating and evaporating step, the silicon tetrachloride will melt and begin volatilizing When the solubility of silicon in silicon tetrachloride is reached, silicon will begin to precipitate out onto the surface of the substrate. If the substrate is silicon, the depositing silicon will form an epitaxial patterned layer or film.

In the medium power mode, a larger number of silicon atoms will be produced by the electron beam. They will remain in solution until the solubility concentration is reached. They will then begin depositing epitaxially if the substrate is silicon. The silicon tetrachloride layer will freeze before all of the silicon has deposited. The remainder of the silicon atoms will come down during the heating process.

In the so-called high power mode, all the silicon tetrachloride is converted to liquid silicon. As the silicon freezes, the region nearest the substrate will freeze first and the solid-liquid interface will move upward. If the thermal gradients are properly controlled so that the liquid silicon does not freeze too quickly, the entire silicon layer will be grown epitaxially with the silicon substrate. If the liquid layer freezes too quickly, the deposited film will be a polycrystalline silicon film or layer. The polycrystalline film may be converted to monocrystalline material by an additional high power bombardment.

PRODUCTION OF A PLANAR NPN TRANSISTOR

The following is an example of the use of the process for forming a planar passivated silicon semiconductor device. This example illustrates the simplicity and economy of the process. It will be obvious to anyone skilled in the art that the method is applicable to the formation of germanium semiconductor and other semiconductor devices, and to devices other than NPN transistors. For example, the process is suited for the integrated circuit technology wherein a multiplicity of different devices may be formed on a single substrate. As will be apparent later, by employing the apparatus and method of the present invention, integrated or micro circuits including capacitors, resistors, transformers and the like may be fabricated in accordance with the present invention.

Figure 3:
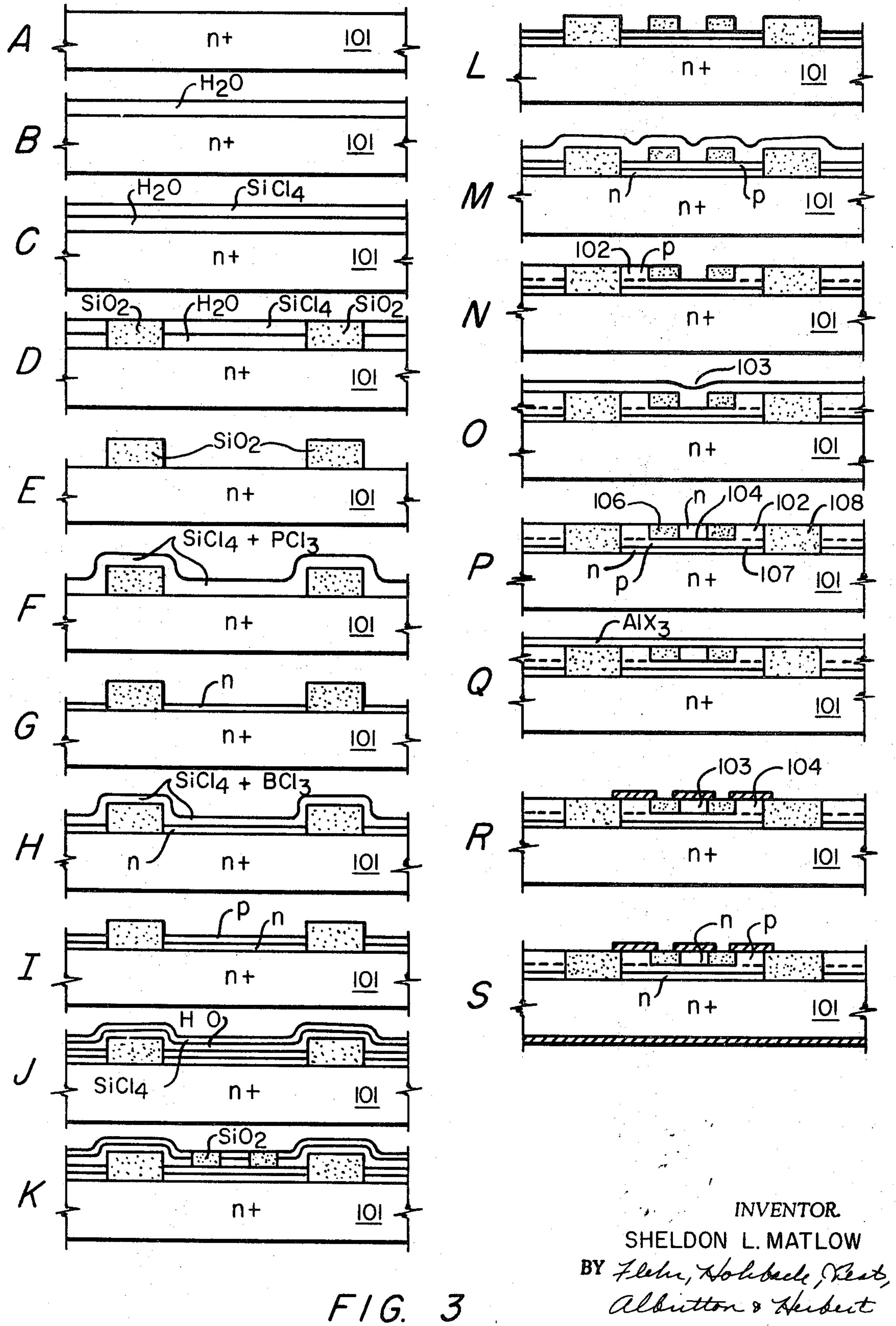
FIG. 3 shows the steps in forming a semiconductive device with the apparatus and in accordance with the method of the resent invention.

The steps in the formation of an NPN transistor are shown in FIGS. 3A–3S. The starting substrate may, for example, be a slice or wafer of highly doped n-type material, n+, FIG. 3A. The material is suitably cleaned as, for example, by cleaning in hydrofluoric acid and washing in filtered deionized or distilled water and dried. The wafer is then placed on the stage and clamped. The apparatus is evacuated; the bell jar heated and flushed; and the surface of the wafer is further cleaned by bombardment of the surface with the electron beam.

The temperature of the wafer or substrate is then reduced by cooling the stage. After the substrate has been reduced to a sufficiently low temperature, a layer of water is deposited by introducing water vapor into the chamber. The water vapor condenses and freezes on the surface of the substrate to form a frozen film, FIG. 3B. Subsequently, silicon tetrachloride $SiCl_4$ vapor (melting point of −70° C., boiling point of 57.57° C.) is introduced into the chamber from a reagent reservoir. The vapor strikes the cold surface, condenses and freezes as a thin film, FIG. 3C. The surface is then bombarded by the electron beam in a predeterminel pattern. Where the electron beam strikes the layer, the water reacts with the silicon chloride to form silicon dioxide ($SiO_2$) and hydrogen chloride (HCl). The remainder of the area is unconverted or unreacted, FIG. 3D. The stage is heated and the water, silicon chloride and hydrogen chloride (HCl) are evaporated off leaving a patterned thin film of silicon dioxide on the surface of the wafer, FIG. 3E. The windows in the $SiO_2$ are then scanned with the electron beam to remove any residual contaminants.

The stage is again cooled and a vapor containing silicon atoms doped with the proper amount of phosphorus, arsenic or tin is introduced into the chamber and allowed to condense on the surface. For example, the reagent may be silicon tetrachloride doped with the proper amount of phosphorus trichloride ($PCl_3$) which is introduced into the chamber above the substrate to condense and form a thin film on the surface of the wafer and the silicon dioxide film. The electron beam is then turned on and scans the areas between the silicon dioxide to convert the layer by releasing the chlorine and leaving silicon doped with phosphorus, n-type silicon film, as a thin film on the surface. The temperature is then raised to evaporate the unconverted silicon and phosphorus chlorides to leave a wafer having a patterned silicon dioxide film with n-type silicon film therebetween, FIG. 3G.

Valve 22 is closed and valve 58 opened, admitting argon into the chamber. Valves 58 and 24 are then closed, and valve 16 is opened. When the pressure drops to about 1 micron, valve 16 is closed and valves 24 and 22 are opened. When the pressure drops to $10^{-6}$ mm., the n-type surface is scanned with the electron beam to remove residual contaminants.

The wafer is cooled and a mixture of silicon tetrachloride vapor and boron trichloride vapor ($BCl_3$) is introduced into the chamber to condense on the cooled surface. The surface is then selectively bombarded with the electron beam and heated to evaporate off the unconverted portions of film to leave a device having a p-type layer forming a p-n junction with the n-type layer, FIG. 3I.

The next steps in the process of forming the device are illustrated in FIGS. 3J–3L and comprise introducing a layer of water, a layer of silicon chloride, selectively bombarding to convert regions into silicon dioxide. The sample is then heated to evaporate off the unconverted areas to provide portions of the p-type regions protected by an oxide layer. The p-type surface is scanned with the electron beam to remove residual contaminants.

A mixture of silicon and boron halide vapor is then introduced to form a frozen layer, FIG. 3M. The frozen layer is selectively bombarded to convert the portions 102. The substrate is heated to evaporate off the unconverted material whereby there is formed a p-type ring, FIG. 3N, which merges with the underlying p-type region and which extends to the upper surface of the device substantially coplanar with the silicon dioxide surface.

A mixture of silicon and phosphorus halide is introduced to form a frozen layer, FIG. 3O. The center region 103 is bombarded to form an n-type region and the device heated to leave the device shown in FIG. 3P.

The device has an n-type plug forming a junction 104 with the underlying p-type layer. The p-type layer includes ring portions 102 extending to the surface. The p-type layer, in turn, forms a junction with the underlying n-type region. The junctions between the various regions are all protected by the silicon dioxide layers. The junction 104 is protected by the oxide ring 106, while the junction 107 is protected by the oxide ring 108.

Figure 4:
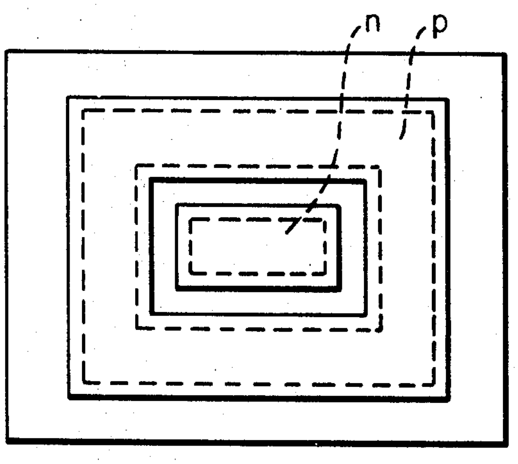
FIG. 4 is a plan view of a device constructed in accordance with FIG. 3.

The subsequent step is to form a frozen film of a suitable metallic vapor such as aluminum halide or aluminum alkyl, FIG. 3Q. The film is bombarded at selected contact regions into aluminum. The substrate is then heated to evaporate the unconverted material leaving aluminum areas in contact with the emitter region 103 and the base region 104 which extend to the upper surface of the device, FIG. 3R. The wafer is then removed from the vacuum chamber and ohmic contact made to the other face to form the collector contact, FIG. 3S. The slice can be diced to provide individual transistors such as shown in sectional view, FIG. 3S, and plan view, FIG. 4.

FORMING ETCH RESIST MASK

In some instances, it is desired to form an accurate etch resistance mask. In this example, the chemical compound introduced may be a monomer such as styrene or methylmethacrylate or a mixture of monomers. The medium power mode will produce, for example, a molten layer of styrene with excited ionied molecules of styrene. These excited ionized species will cause the liquid styrene to polymerize. After the substrate is heated, it is removed from the chamber and placed in an etch solution.

CONDUCTIVE NETWORKS AND MULTILAYERED BOARDS

Conductive networks and multilayer board may be formed by the process. If a copper network is desired, a compound such as copper acetylacetonate is frozen onto the substrate. Other metals can be deposited, for example, nickel from nickel carbonyl; aluminum from aluminum chloride or aluminum trimethyl.

If a multilayer board is desired, the substrate is recooled after the formation of the first conductive pattern and a polymer deposited everywhere except where the crossover connections and external contact tabs are desired. When the formation of the polymer film is completed, the substrate is recooled and a new conductive pattern formed in accordance with the process. The process may be repeated to form a multilayered board of any desired number of layer and any desired pattern.

RESISTORS AND RESISTIVE NETWORKS

Resistors and resistive networks may be formed as thin films on the surface of a substrate. After the desired conductive networks have been deposited, a mixture of boron trichloride and silicon tetrachloride may be deposited over a thin layer of water. The electron beam will then produce a layer of borosilicate glass everywhere except where the resistors are desired. The borosilicate glass is used to encapsulate the resistors. Other materials can be used, of course. The resistors are then put down using, for example, a layer of water and a layer of stannic chloride doped with $SbCl_5$. The resistors are thus seated in pockets in the borosilicate glass. A conductive network is then deposited over the resistors.

CAPACITORS

Capacitors may be formed in a similar manner, except that titanium chloride is used instead of $SnCl_4$. It is obvious that these two processes can be combined to sequentially deposit resistors and capacitors so that a resistive-capacitive network can be formed.

TRANSFORMERS

Micro miniature transformers may be formed by the process. For example, two patterns of parallel strips of conductors may be deposited on the substrate. One pattern will become the primary winding; the other, the secondary. Layers of water and beryllium acetylacetonate are reacted to form a layer of BeO, beryllium oxide. Windows are left in this oxide layer for the ferrite core and vertical branches of the windings. Layers of water and ferric acetylacetonate, nickel acetylacetonate and magnesium acetylacetonate are reacted to form nickel magnesium ferrite. The winding windows in the beryllium oxide are then filled with winding metal. Finally, the upper horizontal windings and the connecting contacts are deposited. These transformers can be used individually.

From the above description, it is, of course, apparent that the various techniques briefly described can be combined to form integrated, hybrid and monolithic integrated circuits. The various components of the circuits, such as resistors, capacitors, transformers and the like, may be formed on the surface with the interconnections and semiconductor devices. The complete integrated circuit may be formed by sequential operations in the vacuum chamber and removed as a complete and integral device.

MAGNETIC MEMORY DISCS

Figure 5:
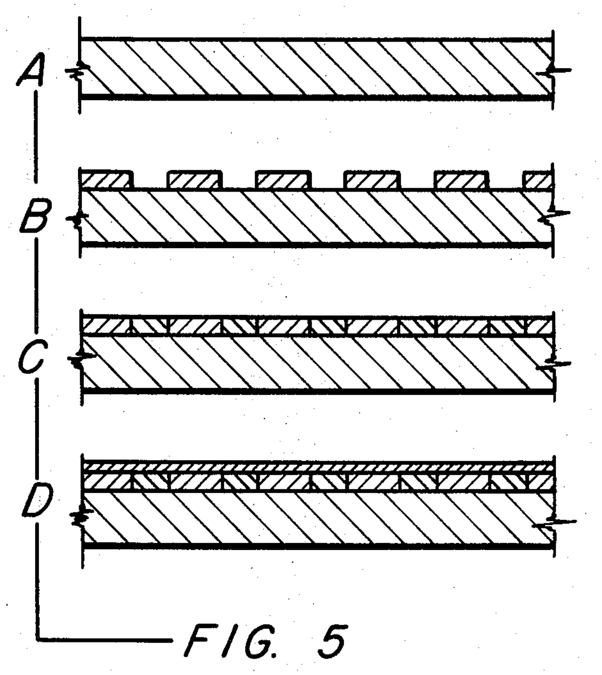
FIG. 5 shows the steps in forming a magnetic memory.

The process and apparatus can be used to manufacture high density magnetic memory discs. The substrate or die may be a non-magnetic ceramic such as BeO or $Al_2O_3$, or a non-magnetic metal such as alumimum. The first step is to clean the substrate. An ultrasonic detergent water cleaning may be used, followed by a rinse with filtered deionized water. The substrate is then dried, placed and clamped onto the stage. The substrate is shown in FIG. 5A. A film of aluminum chloride and a film of water are frozen onto the substrate in the order listed. The system is then bombarded to produce $Al_2O_3$ everywhere except for one micron diameter areas spaced one or more microns apart. The substrate is heated to form the structure shown in FIG. 5B. If the memory material is to be a nickel cobalt alloy, $CO_2(CO)_8$ and $Ni(CO)_4$ in the desired ratio are frozen onto the substrate as a thin film. If a ferrite memory material is desired, the reagents frozen onto the substrate as a thin film may be, for example, $Fe(AA)_3$, $Ni(AA)_2$ and $Mg(AA)_2$ and water in the desired ratio. The symbol AA designates acetylacetonate anions. In either case, the film is then bombarded to produce the magnetic material in the open areas or holes and heated to vaporize the unconverted portion to form the structure shown in FIG. 3C. If the discs are to be used with contacting heads, the substrate is then cooled and coated with frozen $Rh(AA)_3$ or $Rh(CO)_4$. The entire surface is then bombarded to produce a continuous layer of rhodium such as shown in FIG. 5D.

Since the magnetic material regions are isolated from each other, each such region can be used to store one information bit. High packing densities can be achieved, in the order of $2\times10^8$ bits per cm.$^2$ or more.

The read-write-erase circuitry and leads associated therewith can be formed on a substrate with the apparatus and method. Note particularly the processes for forming thin film transformers, coils, transistors, interconnecting leads, capacitors, active devices and other components of a circuit.

APPARATUS

Figures 6, 7:
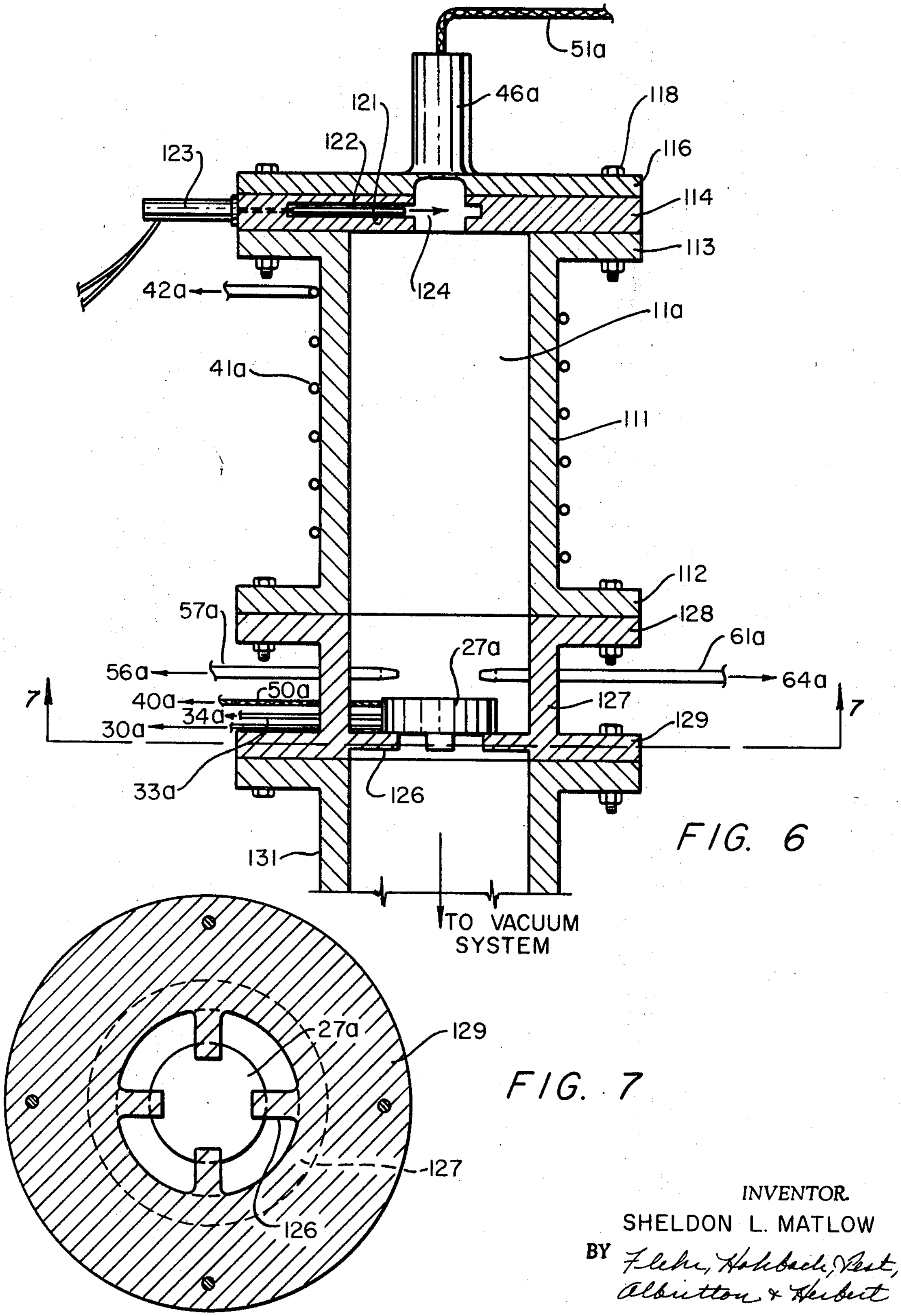
FIG. 6 shows another apparatus in accordance with the invention.
FIG. 7 is a sectional view taken along the line 7—7 of FIG. 6.

Another apparatus in accordance with the invention is shown in FIGS. 6 and 7. In the description to follow, parts corresponding to those shown and described in FIG. 1 will bear like numbers but will include the letter designation *a*. The apparatus includes a vacuum chamber **11*a* which is formed from a cylindrical pipe section 111 having flange 112 and 113 at opposite ends thereof. A shutter holder 114 is received by the upper flange 113. A plate 116 which includes an electron gun assembly 46*a* is placed over the shutter holder. The shutter and electron gun assembly are sealed by bolts 118 which extend through the members 114, 116 to secure the same to the flange 113**. Sealing gaskets may be provided between the members.

The shutter holder includes a slot 121 which is adapted to receive slidable shutter 122. The shutter 122 is moved by solenoid 123. The solenoid moves the shutter 122 in the direction indicated by the arrow 124 to seal off the electron gun **46*a* from the vacuum chamber 11*a*. The shutter may comprise a gate type valve of the type used in vacuum systems. The electron gun 46*a*** is of the type previously described in connection with FIG. 1.

The stage or support **27*a* is held by stage supports 126 which extend inwardly from the cylindrical stage section 127. The stage section includes upper and lower flanges 128 and 129. The upper flange 128 is secured to the lower flange 112 of the section 111 to form a vacuum joint. The lower flange 129 is secured to the header 131** which is connected to suitable vacuum apparatus of the type previously described.

Feed-throughs may be formed in the section 127 to provide for the feed-through of reagent and argon tubes **57*a* and 61*a*, electrical wiring 33*a* for the stage heater, thermocouple leads 50*a*** and the like, as previously described. The vacuum chamber assembly shown in FIGS. 6 and 7 is easily disassembled by loosening the bolts securing the flanges together and the stage section may be removed to replace stages or to introduce new samples onto the stage. Operation of the vacuum system and coating apparatus is as described with reference to FIG. 1.

Thus, it is seen that there is provided an improved method and apparatus for forming thin films in controlled patterns. The method provides for making single and multilayered structures including a variety of materials whereby active and inactive devices such as transistors, diodes, resistors, capacitors, transformers can be formed. Further, the process can be employed to provide multilayer structures whereby complex circuits can be easily formed.

I claim:

1. The method of forming on predetermined surface areas of a substrate a thin film of selected material comprising the steps of cooling the substrate to a predetermined temperature, exposing the substrate to a vapor including molecules containing atoms of said selected material, said temperature being below the freezing temperature of said vapor whereby the vapor condenses as a solid film on the surface of the substrate, converting selected areas of said solid film by chemical reaction, and heating the substrate to remove the unconverted patterns of said film by vaporization leaving the converted portions on the surface of said substrate.

2. The method of forming on predetermined surface areas of a substrate a thin film of selected material comprising the steps of cooling the substrate to a predetermined low temperature, providing a vapor including molecules containing atoms of the selected material at the surface of said substrate, said temperature being below the freezing temperature of said vapor whereby the vapor freezes as a solid film on the surface of said substrate, bombarding selected areas of said film to convert said areas by chemical reaction, and heating the substrate to remove the unconverted portions of the film by vaporization leaving the selected areas.

3. A method as in claim 2 wherein the vapor provided at the surface includes different kinds of molecules containing different atoms such that when the selected areas are converted the atoms combine to form the desired material of the final film.

4. The method as in claim 3 in which said selected material is a magnetic material.

5. The method as in claim 3 in which said selected material is a ferrite material.

6. The method of forming thin films of different materials having a predetermined pattern on the surface of a substrate comprising the steps of cooling the substrate to a predetermined low temperature, providing a vapor containing atoms of a selected first material at the surface of said substrate, said temperature being below the freezing temperature of said vapor whereby the vapor freezes as a solid film on the surface of the substrate, bombarding selected areas of said film to convert said areas of the frozen film, heating the substrate to remove the unconverted portions of the frozen film leaving said converted portions of said first material at said selected areas, again cooling the substrate to a predetermined low temperature, providing a vapor containing atoms of a selected second material at the surface of said substrate, said temperature being below the freezing temperature of said vapors whereby the vapor freezes as a solid film on the surface of the substrate, bombarding selected areas of said frozen film to leave said unconverted areas of the film at said selected areas, and heating the substrate to remove the unconverted portions of the film to leave said converted second material at said selected areas.

7. The method as in claim 6 in which the selected areas of the first and second bombardment are adjacent to one another on said surface to form an interdigitated pattern of said first and second materials.

8. The method as in claim 6 in which the selected areas for the first and second bombardment occupy substantially the same surface area to form layers of said second material overlying layers of said first material.

9. The method as in claim 6 in which the selected areas occupy both the same and adjacent areas.

10. The method as in claim 8 wherein said first and second materials are the same material.

11. The method as in claim 8 wherein said first vapors contain silicon atoms and doping atoms characterizing one conductivity type and said second vapor contains silicon atoms and doping atoms characterizing an opposite conductivity type to form first and second layers of different conductivity types overlying one another and defining a rectifying junction.

12. The method as in claim 9 wherein the first vapor contains atoms characterizing a portion of a device to which electrical contact is to be made, and the second vapor contains atoms of a metal to provide a conductive connection to said first area.

13. The method of forming isolated semiconductor devices which comprises the steps of forming a frozen film containing atoms of passivating material on the surface of a silicon wafer, bombarding selected areas of said wafer to convert said selected portion of said film area to passivating material, heating the substrate to evaporate the unconverted portions leaving a pattern insulating thin film on the surface of said wafer, freezing a film containing silicon atoms and doping atoms on the surface of said wafer, bombarding the regions of said film within the openings to convert the same, heating the wafer to evaporate the unconverted silicon, freezing a second film containing silicon atoms and doping atoms on the surface of said substrate, bombarding said selected portions of said substrate to convert the said portions, and heating the substrate to evaporate the unconverted portions.

14. The method as in claim 13 in which said first layer includes doping atoms characterizing one conductivity type and said second layer includes doping atoms characterizing an opposite conductivity type whereby said first and second remaining converted portions form a p-n junction.

15. The method as in claim 14 including the additional step of providing a third film containing silicon atoms and doping atoms characterizing said one conductivity type, bombarding said selected areas, and heating said substrate to leave a third layer forming an n-p junction with said second layer.

16. The method as in claim 14 wherein said one conductivity type is p-type and said opposite conductivity type is n-type to thereby form a p-n-p semiconductor device.

17. The method as in claim 14 wherein said one conductivity type is n-type and said opposite conductivity type is p-type to thereby form an n-p-n semiconductor device.

18. The method as in claim 14 including the additional step of freezing a film containing metal atoms, bombarding selected portions to convert the same, heating the film to evaporate the unconverted portions to leave a conductive pattern making ohmic contact with selected areas of said semiconductor device and extending over portions of the oxide layer.

19. The method of forming on predetermined surface areas of a substrate a thin film of selected material comprising the steps of freezing from a vapor including atoms of said material a solid film containing said material atoms on the surface of said substrate, bombarding selected areas of said film to chemically convert said areas, and heating the substrate to remove by vaporization the unconverted portions of the film to leaving the selected areas.

20. The method as in claim 19 in which said selected material is a magnetic material to form a patterned magnetic film.

21. The method as in claim 19 in which said selected material is a ferrite material to form a patterned ferrite film.

22. The method of forming on predetermined surface areas of a substrate a thin film of selected material comprising the steps of cooling the substrate to a predetermined low temperature, sequentially providing vapors containing atoms of selected material at the surface of said substrate to form a multi-layered frozen film on said substrate, said temperature being below the freezing temperature of said vapors whereby a multi-layered frozen film is formed on the surface of said substrate, bombarding selected areas of said film to convert said areas, and heating the substrate to remove the unconverted portions of the film leaving film at the selected areas.

References Cited

UNITED STATES PATENTS

| | | | |
|---|---|---|---|
| 2,989,385 | 6/1961 | Gianola et al. | |
| 3,178,804 | 4/1965 | Ullery et al. | |
| 3,179,542 | 4/1965 | Quinn et al. | 148—177 |
| 3,234,044 | 2/1966 | Andes et al. | 117—212 |
| 3,340,601 | 9/1967 | Garibotti | 29—582 |
| 3,351,503 | 11/1967 | Fotland | 148—188 |

PAUL M. COHEN, Primary Examiner

R. B. LAZARUS, Assistant Examiner

U.S. Cl. X.R.

29—585; 148—175